United States Patent [19]
Stauder et al.

[11] Patent Number: 5,492,606
[45] Date of Patent: Feb. 20, 1996

[54] METHOD FOR SELF-STABILIZING DEPOSITION OF A STOICHIOMETRIC COMPOUND BY REACTIVE SPUTTERING

[75] Inventors: Bruno Stauder, Saint-Nicolas; Frédéric Perry, Villers-les-Nancy; Claude Frantz, Laxou; Alain Billard; Philippe Pigeat, both of Nancy; Gérard Henrion, Champigneulles, all of France

[73] Assignee: Institut National Polytechnique de Lorraine, France

[21] Appl. No.: 172,549

[22] Filed: Dec. 23, 1993

[30] Foreign Application Priority Data

Dec. 30, 1992 [FR] France .................................. 92 15924

[51] Int. Cl.$^6$ .................................................. C23C 14/34
[52] U.S. Cl. ................................ 204/192.12; 204/298.08
[58] Field of Search ....................... 204/192.12, 192.15, 204/192.25, 298.08, 192.13, 298.03

[56] References Cited

U.S. PATENT DOCUMENTS

| 4,931,169 | 6/1990 | Scherer et al. | 204/298.11 |
| 5,108,569 | 4/1992 | Gilboa et al. | 204/298.08 |
| 5,180,476 | 1/1993 | Ishibashi et al. | 204/298.08 |
| 5,292,417 | 3/1994 | Kügler | 204/298.08 |

FOREIGN PATENT DOCUMENTS

| 275018 | 7/1988 | European Pat. Off. . | |
| 430229 | 6/1991 | European Pat. Off. . | |
| 508359 | 10/1992 | European Pat. Off. . | |
| 2503190 | 10/1982 | France . | |
| 262246 | 11/1988 | Germany | 204/298.08 |
| 63-176466 | 7/1988 | Japan | 204/298.08 |
| 2-38566 | 2/1990 | Japan | 204/298.08 |

*Primary Examiner*—Terry J. Owens
*Attorney, Agent, or Firm*—Rosenman & Colin

[57] ABSTRACT

Method for self-stabilizing deposition of a stoichiometric compound by reactive sputtering using a cold plasma. A reactive gas is supplied to a target, the instantaneous power applied to the target is cyclically reduced and increased at a frequency sufficiently low that a reaction between the target material and the reactive gas takes place on the surface of the target, and the product of the reaction is then sputtered off the surface of the target and onto a substrate. The alternating decrease and increase of the instantaneous power applied to the target at low frequency provides for self-stabilizing deposition of the reaction product on the substrate.

8 Claims, 4 Drawing Sheets

METHOD FOR SELF-STABILIZING DEPOSITION OF A STOICHIOMETRIC COMPOUND BY REACTIVE SPUTTERING

BACKGROUND OF THE INVENTION

1. Field of the Invention

The present invention concerns a method which, by promoting the stabilization permits control of the metalloid concentration of a deposit produced by cold plasma sputtering in reactive vapor phase.

2. Discussion of Related Art

Methods of physical deposit in reactive vapor phase of the type mentioned above, including, for instance, reactive magnetron sputtering in direct current or radiofrequency of a metallic or semiconductor target in the presence of a reactive gas ($O_2$, $N_2$, $CH_4$, $B_2H_6$, $SH_2$, etc.), which provides the metalloid element. The plasmagenic gas responsible for the sputtering of the target is a rare gas, for instance argon. The alloys capable of being synthesized therefore have a base of a metal or of a semiconductor enriched in metalloid (O, N, C, B, S). As to the stoichiometric compounds, they may be oxides, nitrides, carbides, borides or sulfides. These alloys or compounds can be deposited on semi-conductive or insulating metallic substrates.

The sputtering of a metallic or semiconductive target is said to be reactive when it takes place in the presence of a gas which is chemically active with respect to the vapor given off by said target. When, in the presence of an electric discharge which creates a plasma, a reactive gas is introduced into the reactor, a fraction of this gas interacts with the different receiving surfaces (walls of the reactor, substrate, target), any excess fraction being evacuated by pumping apparatus.

This means that the partial pressure $P_R$ of reactive gas is less than that which would be established in the absence of discharge and that the electrical characteristics of the emitting target are affected both by the increasing participation of the reactive type in its sputtering, by the possible modification of the chemical nature of its surface, and by a change in the conditions of excitation and ionization of the plasmagenic gas.

The main difficulty in reactive sputtering is maintaining a stable regime which makes it possible to control the metalloid composition of the deposit, or its stoichiometry in the case of a compound. In fact, experience as well as calculation based on recent models of reactive magnetron sputtering show that this corresponds to a non-linear phenomenon which results in a hysteresis effect appearing on the curves which relate the partial pressure $P_R$ of reactive gas, the concentration $C_{Me}$ of metalloid in the deposit, the velocity $V_D$ of deposit and the electrical characteristics of the discharge (target current and target voltage for a continuous discharge or auto-polarization voltage for a radiofrequency discharge) to the rate of flow of reactive gas $D_R$ introduced into the reactor.

FIGS. 1, 2 and 3 show the values $P_R$, $C_{ME}$ and $V_D$, respectively, as a function of the rate of flow $D_R$ in the methods of the prior art.

Two sputtering modes can be noted on these curves:

1) For rates of flow of reactive gas less than $(D_R)_A$, the reactive types intercepted by the target are sputtered back before having been able to react with the target in order to form a stable reaction product: This sputtering regime referred to as elementary sputtering regime (ESR), leads to a high deposit velocity and a continuous enrichment of metalloid in the deposit. It is characterized by a low partial pressure of reactive gas, the latter being consumed by reaction on the walls and the substrate with the vapor coming from the target.

2) For rates of flow of reactive gas greater than $(D_R)_A$, the reactive types react very rapidly with the target to form a stable superficial compound having, in general, a low rate of sputtering (oxide, nitride, carbide, boride, sulfide); this sputtering regime, referred to as compound sputtering regime (CSR) results in a sudden increase in the partial pressure $P_R$ of reactive gas due to the saturation of the walls, associated with a large decrease in the deposit velocity. The metalloid concentration of the deposit suffers a discontinuity in order to reach its limit value, which corresponds to that of the richest stoichiometric compound.

The ESR→CSR and CSR→ESR transitions which take place at the critical rates of flow $(D_R)_A$ and $(D_R)_C$ respectively are unstable and result in a runaway effect which forces the operating point of the reactor to change from A to B or from C to D depending on whether the rate of flow of reactive gas increases or decreases. The AB and CD parts of the curves thus define a region of hysteresis which is wider and more abrupt the greater the difference between the respective rates of sputtering of the target in its elementary state and in its contaminated state.

The existence of a hysteresis makes production with a high velocity of deposition of the richest stoichiometric compound or of deposits the composition of which is within the hatched region of FIG. 2 extremely difficult. As a matter of fact, only a very sophisticated closed-loop control with microprocessor and with very short time of response makes it possible at times to maintain the operating point within the instability regions, for instance by having the rate of flow of reactive gas or the power dissipated on the target controlled by the intensity of an optical emission ray specific to a constituent element of the target. Such a means of control has in the best of cases a response time of a few tenths of a second, which, while suitable for the production of certain compounds, frequently proves much too long, for instance in the case of alumina $Al_2O_3$: as a matter of fact, molecular oxygen can react with the aluminum target by a very rapid chemisorption mechanism since only a few milliseconds are necessary for a chemisorbed monolayer to be formed.

It has therefore been proposed to reduce, or even eliminate, the hysteresis region. It is known that an increase in the pumping speed acts in this direction but, unfortunately, this very rapidly becomes prohibitive in most cases.

The same is true of the artificial decrease of the total area of the receptive walls of the reactor by the use of a sleeve or screens, as well as means which are directed at increasing the reactivity of the metalloid types in the vicinity of the substrate by creating, for instance, a favorable gradient of the reactive gas partial pressure by a suitable selection of its site of introduction into the reactor; these latter methods prove effective only when the reactive gas can naturally interact with the vapor coming from the target, as is true, for instance, of molecular oxygen in its fundamental state.

SUMMARY OF THE INVENTION

The present invention is directed at overcoming these drawbacks.

For this purpose, the object of the invention is a method which favors the stabilizing of the physical process of deposition and thus makes it possible to control the metalloid concentration of a deposit on a substrate produced by physical means in reactive vapor phase by a cold plasma sputtering of a target. In accordance with the invention, the instantaneous power applied to the target is reduced and increased cyclically at low frequency in such a manner as to alternately cause a reaction between the target and the reactive gas and to sputter the product of said reaction.

The reduction may even extend up to a removal of power. The increase is a consequence of an electric pulse the shape and amplitude of which may be complex. For example, by low frequency there is understood a frequency such that it makes it possible to obtain the aforesaid alternating reaction-sputter cycle. One will in particular distinguish the invention from the methods of cutting micro-arcs which may be produced on the least eroded zones of the target (in the case of feed by a negative direct voltage) at the places where the appearance of a dielectric reaction product is the most probable. These micro-arc cutting methods use cycle periods that are very much shorter than those of the invention, generally on the order of a microsecond.

The person skilled in the art can, in any event, determine experimentally, case by case, the characteristics of shape, amplitude, duration, and frequency of the cycle of reduction and increase in power applied to the target as a function of the physical characteristics of the device and the nature of the materials.

In general, the frequency of this reduction in power is preferably between 0.1 and 1000 Hz, and the time of this reduction is preferably between 100/f and 800/f milliseconds, in which f is said frequency.

More particularly, the frequency may be between 1 and 100 Hz and the time of the reductions in power between 1 millisecond and 800 milliseconds.

The invention therefore consists essentially in effecting an automatic control in real time of the chemical reaction which is capable of taking place on the surface of the target and thereby of the vapor flux coming from the target, due to the superimposing of electric pulses or oscillations of low frequency on the feed voltage of the target (direct voltage, radiofrequency voltage or superimposing of the two). These electric pulses or oscillations of suitable shape and amplitude, duration and frequency must produce an extinction of the plasma or a substantial decrease in the instantaneous power applied to the target for a period of time compatible with the diffusion velocities and the reaction times of the metalloid types of the plasma with the different receiving surfaces of the reactor (target, substrate, walls). They must thus permit the controlled formation of a reaction product of very slight thickness on the surface of the target and assure the sputtering thereof during the following phase in which the plasma is fired.

This reaction-sputtering cycle leads to a perfectly stable steady-state regime without runaway phenomenon, which considerably reduces and frequently even eliminates the hysteresis resulting from an uncontrolled reaction on the surface of the target.

High deposition velocities of the stoichiometric compound or of the alloy enriched in metalloid are thus obtained. They are frequently close to those which are obtained with non-reactive sputtering for the pure semiconductor or metal.

Furthermore, the method proposed (if it effects an extinction of the plasma) makes it possible to cut the said micro-arcs. It should be noted, however, that in the case of highly insulating dielectric reaction products, an arc-cutting system operating in known manner per microsecond is preferable in the case of direct current sputtering.

BRIEF DESCRIPTION OF THE DRAWINGS

One particular embodiment of the invention will now be described, by way of illustration and not of limitation, with reference to the accompanying drawings, in which.

DETAILED DESCRIPTION OF A PREFERRED EMBODIMENT

Figure 1:
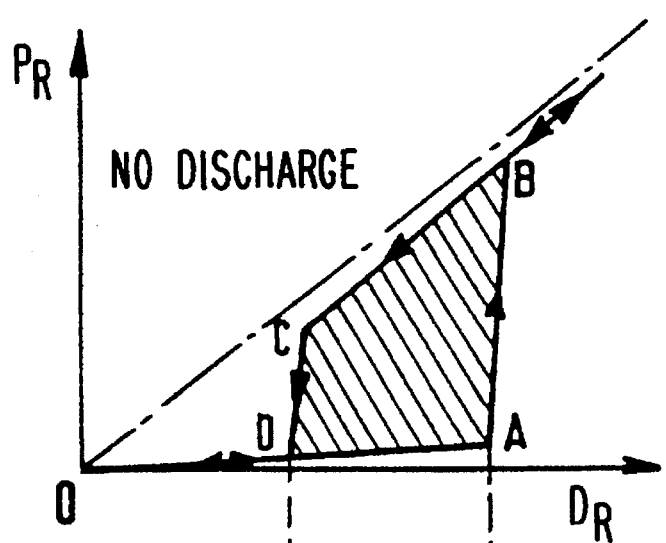
FIGS. 1, 2 and 3 illustrate the operation of the prior-art methods.
Figure 2:
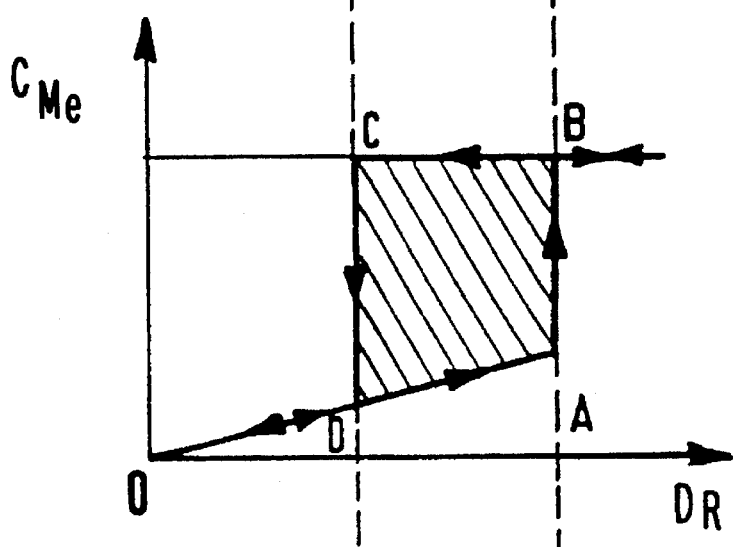
Figure 3:
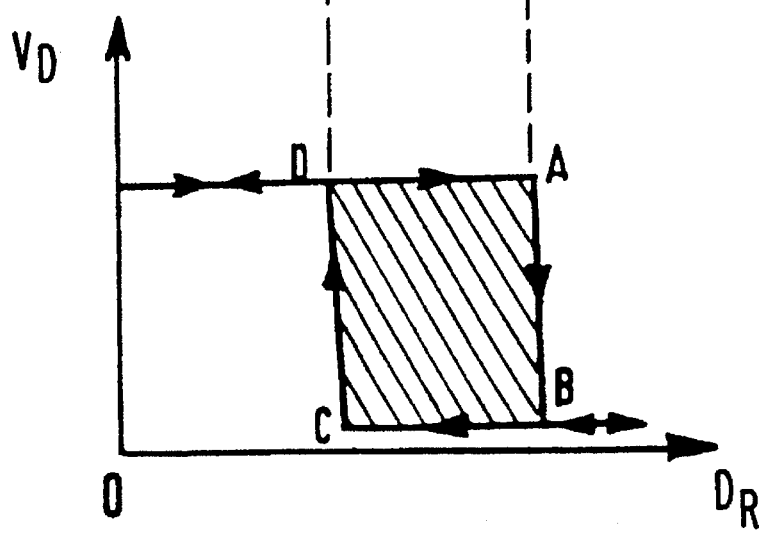
Figure 4:
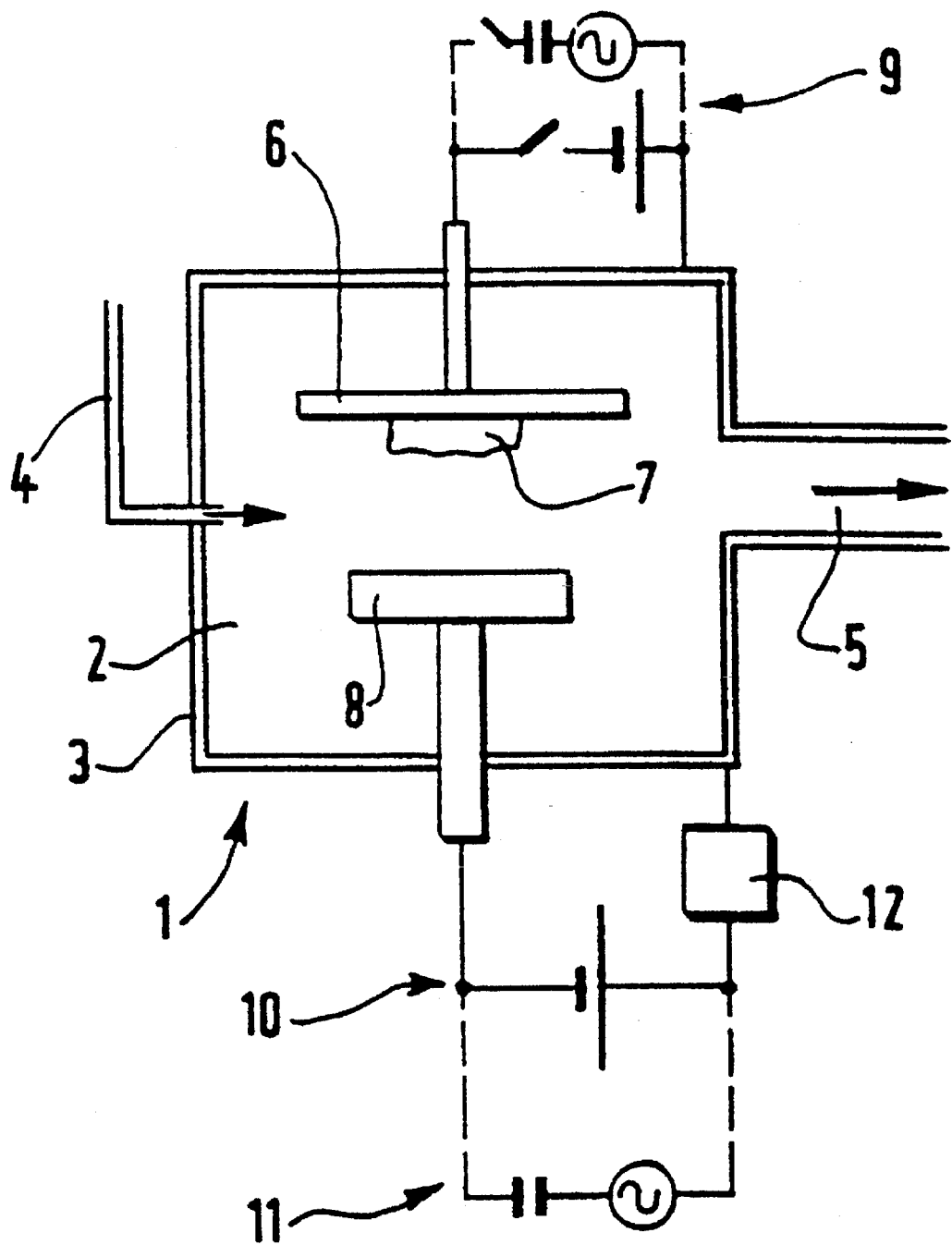
FIG. 4 diagrammatically shows a device permitting the carrying out of the method according to the invention.

FIG. 4 shows a reactor 1 formed of an enclosure 2, defined by walls 3. A conduit 4 permits the introduction into the enclosure 2 of a reactive gas or gaseous mixture as well as a plasmagenic gas, and a conduit 5 connects the enclosure 2 to pump apparatus, not shown, which assures the production of the required vacuum.

Within the enclosure 2, a substrate holder 6 is arranged in such a manner as to receive a substrate 7, opposite a target 8.

The substrate holder 6 may be connected to generators 9 so as to assure its polarization, either direct current or with radiofrequency alternating current.

The target 8 is formed of the metal or the semiconductor which it is desired to deposit in the form of alloy or compound on the substrate 7. The target 8 is fed either with direct current from a generator 10 or with radiofrequency alternating current from a generator 11.

The device as just described is well known in the art.

In accordance with the invention, a device 12 is also provided which makes it possible to superimpose electric pulses or oscillations of low frequency on the negative direct voltage delivered by the generator 10 or on the radiofrequency voltage delivered by the generator 11 or on these two voltages superimposed.

This device, of any suitable electrical and/or magnetic type, makes it possible either to interrupt the feed or to decrease its instantaneous power.

The device described above has been used in magnetron reactive sputtering of targets made of aluminum and zirconium, respectively, of a diameter of 51 mm. The power applied was 260 watts and the target-substrate distance 80 mm.

Figure 5A:
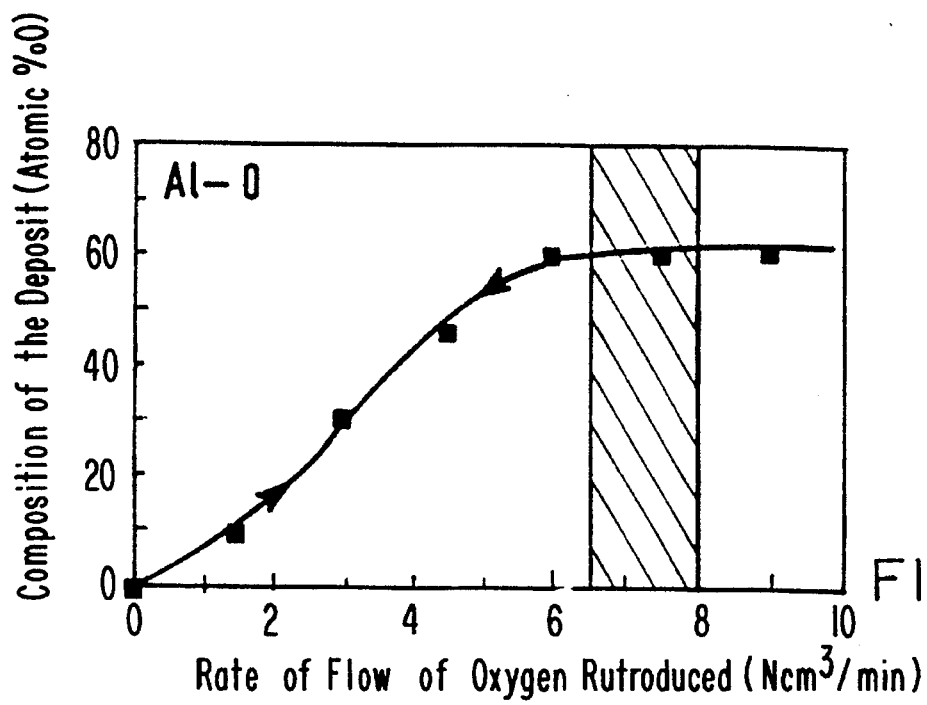
FIGS. 5a and 5b illustrate the operation of this method applied to the deposit of alumina.

The target was fed with a negative direct voltage on which there were superimposed pulses of a frequency of 50 Hertz, creating an extinction of the plasma for 5 milliseconds FIG. 5a shows the composition of the Al–O deposit in atomic percentage of oxygen in the case of an aluminum target as a function of the rate of flow of oxygen introduced through the conduit 4. The rate of flow of argon and the total pressure were 45 N.cm$^3$/mn and 0.8–1 Pa, respectively.

Figure 5B:
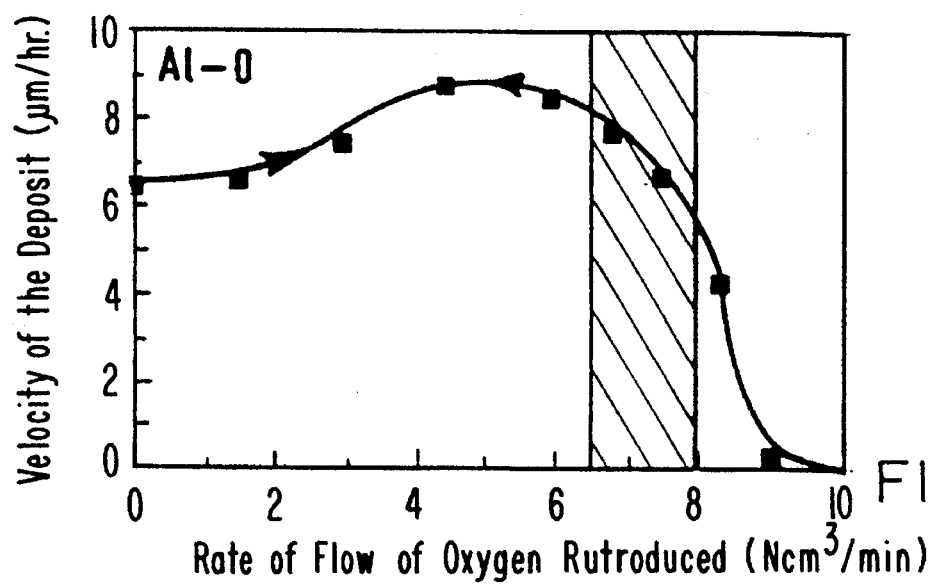

FIG. 5b shows the velocity of deposit as a function of this same rate of flow.

Figure 6A:
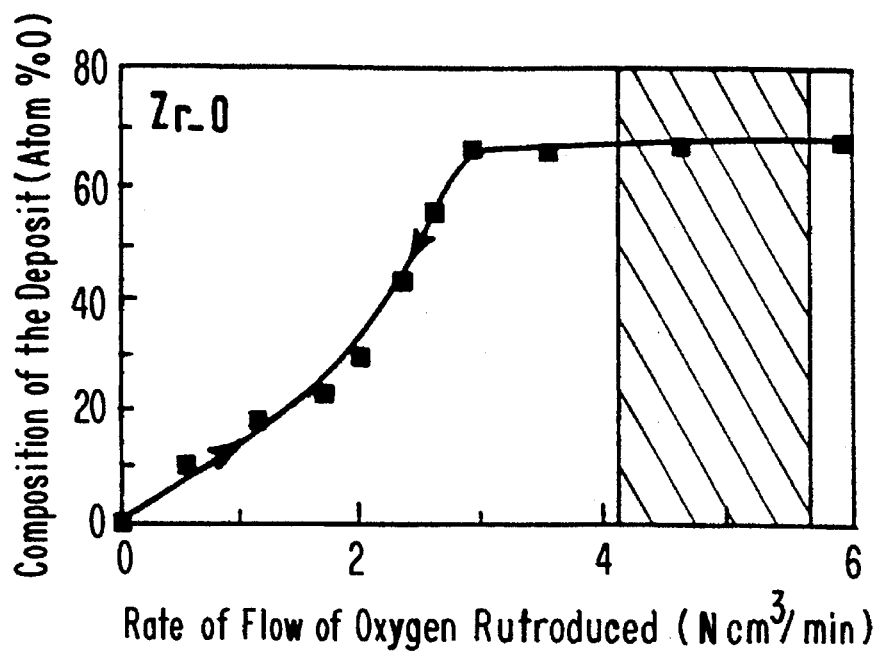
FIGS. 6a and 6b illustrate the operation of this method applied to the depositing of zirconia.
Figure 6B:
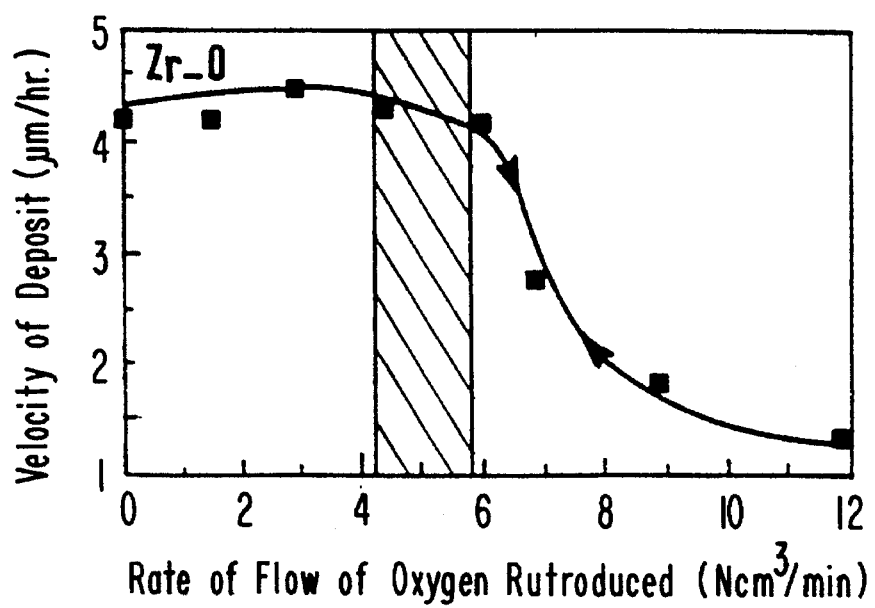

FIGS. 6a and 6b are similar to FIGS. 5a and 5b in the case of a zirconium target. The rate of flow of argon and the total pressure were then 36 N.cm$^3$/mn and 0.3–0.4 Pa, respectively.

It is noted that it is possible to synthesize, around room temperature, alloys of any desired composition and that, in the hatched portions of FIGS. 5a, 5b, 6a and 6b, it is more particularly possible to synthesize perfectly stoichiometric and optically transparent compounds of alumina $Al_2O_3$ and zirconia $ZrO_2$ with deposit velocities similar to those of pure aluminum or zirconium. Within the field of the values of rate of flow of oxygen introduced into the reactor, the curves of FIGS. 5a, 5b, 6a and 6b are completely reversible.

Similar results have been obtained upon the synthesis of aluminum nitride A 1 N or the oxide of spinelle type $(Fe, Cr, Ni)_3 O_4$.

We claim:

1. A method for sputtering a reaction product of a target material and a reactive gas on a substrate by means of a cold plasma used for sputtering the target, said method comprising the steps of:

supplying the gas to the target; and cyclically reducing and increasing the instantaneous power applied to the target at a frequency sufficiently low so as to produce a reaction between the target material and the reactive gas on the surface of the target and then to sputter the product of said reaction from the surface of the target, whereby self-stabilizing deposition of the product onto the substrate is obtained.

2. The method according to claim 1, wherein the concentration of a component of the reactive gas in the deposit is a deposit parameter that is controlled.

3. The method according to claim 1, in which the frequency of said reduction and increase of the instantaneous power is between about 0.1 Hz and 1000 Hz.

4. The method according to claim 3, in which the duration of the reduction and increase of instantaneous power is between 100/f and 800/f milliseconds, in which f is said frequency.

5. The method according to claim 4, in which said frequency is between 1 Hz and 100 Hz and the duration is between 1 ms and 800 ms.

6. The method according to claim 1, in which said reduction of power is an interruption of the power applied to the plasma which causes an extinction of the plasma.

7. A method of reactive magnetron sputtering for coating a substrate with a reaction product produced by a metallic or semi-conductive target that is sputtered by plasma discharge in the presence of reactive gas, said method comprising the steps of:

providing a sufficient plasma density such that the reactive gas reacts with the surface of the target;

increasing the plasma density to sputter the product of said reaction;

decreasing the plasma density so as to cause the reactive gas to react with the target material on the surface of the target again; and alternating said increase and decrease at a frequency sufficiently low so as to produce a self-stabilizing deposition of reaction product on the substrate, whereby growth of a coating having a predetermined stoichiometric composition is achieved.

8. The method of claim 7 wherein the concentration of a component of the reactive gas in the deposit is a deposit parameter that is controlled.

\* \* \* \* \*